US010868198B2

(12) United States Patent
Sulistyanto et al.

(10) Patent No.: US 10,868,198 B2
(45) Date of Patent: Dec. 15, 2020

(54) SEMICONDUCTOR DEVICE INCLUDING ZENER DIODE AND METHOD OF MANUFACTURING THEREOF

(71) Applicant: Vanguard International Semiconductor Corporation, Hsinchu (TW)

(72) Inventors: Priyono Tri Sulistyanto, Yogyakarta (ID); Manoj Kumar, Dhanbad (IN); Chia-Hao Lee, New Taipei (TW); Chih-Cherng Liao, Jhudong Township (TW); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/896,541

(22) Filed: Feb. 14, 2018

(65) Prior Publication Data
US 2018/0175215 A1    Jun. 21, 2018

Related U.S. Application Data

(63) Continuation of application No. 14/473,365, filed on Aug. 29, 2014, now abandoned.

(51) Int. Cl.
*H01L 29/66* (2006.01)
*H01L 29/866* (2006.01)
(Continued)

(52) U.S. Cl.
CPC ........ *H01L 29/866* (2013.01); *H01L 29/0684* (2013.01); *H01L 29/66204* (2013.01); *H01L 29/20* (2013.01); *H01L 29/2003* (2013.01)

(58) Field of Classification Search
CPC .................. H01L 29/66136; H01L 29/66106
See application file for complete search history.

(56) References Cited

U.S. PATENT DOCUMENTS 5,913,122 A * 6/1999 Lee ..................... H01L 27/0928
438/297
6,621,138 B1 * 9/2003 Alter ................... H01L 23/5252
257/530
(Continued)

FOREIGN PATENT DOCUMENTS

TW    200901464 A    1/2009
TW    200922067 A    5/2009

*Primary Examiner* — Moazzam Hossain
*Assistant Examiner* — Hajar Kolahdouzan
(74) *Attorney, Agent, or Firm* — Birch, Stewart, Kolasch & Birch LLP (57) ABSTRACT

A semiconductor device, including an insulator formed on a top surface of a semiconductor substrate, a semiconductor layer, containing a first region of a first conductivity type, formed on the insulator layer, wherein the first region is a P+ region or an N+ region, a second region of a second conductivity type in direct contact with the first region and forming a P-N junction with the first region, wherein the P-N junction comprises a first portion parallel to the top surface of the semiconductor substrate, and the second region is the semiconductor substrate and partially covered by the semiconductor layer, a first metallization region in electrical contact with the first region and a second metallization region in electrical contact with the second region.

20 Claims, 6 Drawing Sheets

(51) Int. Cl.
*H01L 29/06* (2006.01)
*H01L 29/20* (2006.01)

(56) References Cited

U.S. PATENT DOCUMENTS

| | | | |
|---|---|---|---|
| 6,815,797 B1 * | 11/2004 | Dark | H01L 23/5252 |
| | | | 257/344 |
| 2001/0015461 A1 | 8/2001 | Ebina | |
| 2002/0050602 A1 | 5/2002 | Narazaki | |
| 2012/0127619 A1 | 5/2012 | Mikolajczak | |
| 2014/0070344 A1 | 3/2014 | Khalili Amiri et al. | |

* cited by examiner

SEMICONDUCTOR DEVICE INCLUDING ZENER DIODE AND METHOD OF MANUFACTURING THEREOF

CROSS-REFERENCE TO RELATED APPLICATIONS

This application is a Continuation of U.S. application Ser. No. 14/473,365 filed on Aug. 29, 2014, the entire contents of which is hereby expressly incorporated by reference into the present application.

BACKGROUND

Zener diodes are widely used, in applications including rectifiers and voltage regulators, for protecting other semiconductor devices from suffering from an undesired pulse. When a zener diode is reverse-biased, it has the ability to hold the voltage on a certain value, thereby having voltage-stabilizing characteristics.

Zener diodes are also widely used trimming techniques, which are used to make adjustments to an integrated circuit after fabrication. Trimming techniques typically include laser trimming of thin-film resistors and "zener zap" anti-fuse trimming. Zener zap trimming has gained wide acceptance because it is field programmable and is less costly to implement. The zener zap method uses zener diodes having a low to moderate breakdown voltage as trim devices. Typically, a trim circuit includes a string of zener diodes and a string of corresponding resistive elements where each zener diode is connected in parallel to one of the resistive elements. Zener diodes are biased so that they behave as an open circuit as fabricated. When trimming is performed, the zener diode is zapped and the junction is short-circuited. By shorting out selective zener diodes and the associated resistive elements, a desired change in resistance can be obtained.

BRIEF DESCRIPTION OF THE DRAWINGS

For a more complete understanding of the embodiments, and the advantages thereof, reference is now made to the following descriptions taken in conjunction with the accompanying drawings.

SUMMARY

An exemplary embodiment of the present disclosure provides a semiconductor device. The semiconductor device includes an insulator formed on a top surface of a semiconductor substrate. The semiconductor device also includes a semiconductor layer, which contains a first region of a first conductivity type and is formed on the insulator layer. The first region is a P+ region or an N+ region and has a volume of over 50-80% of that of the semiconductor layer. The semiconductor device further includes a second region of a second conductivity type in direct contact with the first region, forming a P-N junction with the first region. In addition, the semiconductor device includes a first metallization region in electrical contact with the first region and a second metallization region in electrical contact with the second region.

An exemplary embodiment of the present disclosure provides a method for manufacturing a semiconductor device. The method includes forming an insulator on a semiconductor substrate. The method also includes depositing a semiconductor layer over the insulator and the semiconductor substrate. The method further includes performing a first implantation process on the semiconductor layer to give it a first conductivity type. In addition, the method includes patterning the semiconductor layer such that the semiconductor layer is isolated with the semiconductor substrate by the insulator. The method further includes forming a photoresist layer over the semiconductor substrate, and the photoresist layer has an opening exposing a portion of the semiconductor layer. The method further includes performing a second implantation process on the exposed portion of the semiconductor layer, through the opening, to form a region of a second conductivity type in the semiconductor layer.

An exemplary embodiment of the present disclosure provides a method for manufacturing a semiconductor device. The method includes forming an insulator on a semiconductor substrate. The method also includes depositing a semiconductor layer over the insulator and the semiconductor substrate. The method further includes performing a first implantation process on the semiconductor layer to give it a first conductivity type. In addition, the method includes patterning the semiconductor layer such that the semiconductor layer is partially located on the insulator and has an extension portion in direct contact with the semiconductor layer. The method includes forming a photoresist layer over the semiconductor substrate. The photoresist layer has an opening exposing a portion of extension portion of the semiconductor layer and a portion of the semiconductor substrate. The method further includes performing a second implantation process on the semiconductor substrate, through the opening, to form a region of a second conductivity type in the semiconductor substrate. The region of the second conductivity type is partially covered by the semiconductor layer.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional steps can be provided before, during, and after the method, and some of the steps described can be replaced or eliminated for other embodiments of the method.

Figure 1A:
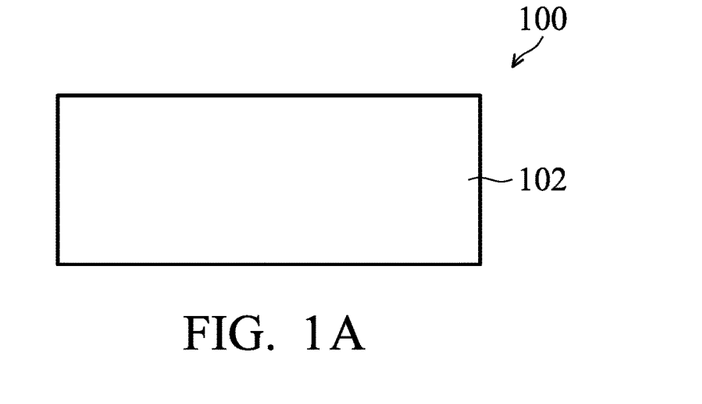
FIGS. 1A-1G illustrate cross-sectional views of a semiconductor device containing a zener diode at various stages of the manufacturing process, in accordance with some embodiments.

FIGS. 1A-1G illustrate cross-sectional views of a semiconductor device containing a zener diode at various stages of the manufacturing process, in accordance with some embodiments. Referring to FIG. 1A, the semiconductor device 100 includes a semiconductor substrate 102. The semiconductor substrate 102 may be a silicon substrate doped with a P-type dopant such as boron, in which case the substrate 102 is a P-type substrate. Alternatively, the semiconductor substrate 102 could be another suitable semiconductor material. For example, the semiconductor substrate 102 may be a silicon substrate doped with an N-type dopant such as phosphorous or arsenic, in which case the substrate is an N-type substrate. The semiconductor substrate 102 may include other elementary semiconductor materials such as germanium or diamond. The semiconductor substrate 102 may optionally include a compound substrate and/or an alloy semiconductor. Further, the semiconductor substrate 102 may include an epitaxial layer (epi layer), being strained for performance enhancement, and may include a silicon-on-insulator (SOI) structure.

Figure 1B:
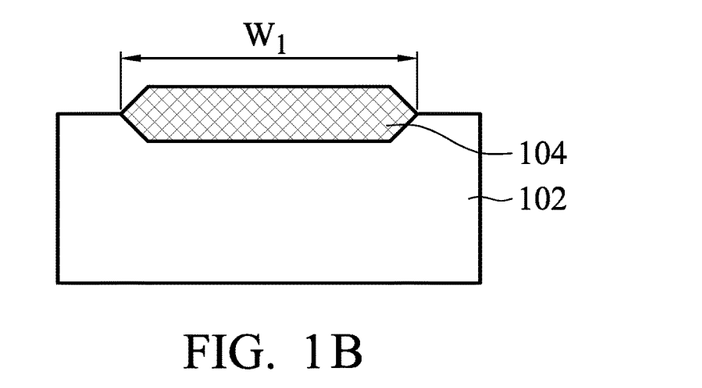

Referring to FIG. 1B, an insulator 104 is formed on a top surface of the semiconductor substrate 102. The insulator 104 may have a first width $W_1$ ranging from about 1 μm to about 20 μm. In some embodiments, the insulator 104 includes a local oxidation of silicon (LOCOS) structure, other suitable isolation structures, or a combination thereof. The insulator 104 may have a top surface that is higher than a top surface of the semiconductor substrate 102. In some embodiments, the insulator 104 includes silicon oxide, silicon nitride, silicon oxynitride, fluoride-doped silicate glass (FSG), a low-K dielectric material, other suitable materials, or a combination thereof. In some embodiments, the insulator 104 is formed by thermal-growing an oxide material through on the semiconductor substrate 102.

Figure 1C:
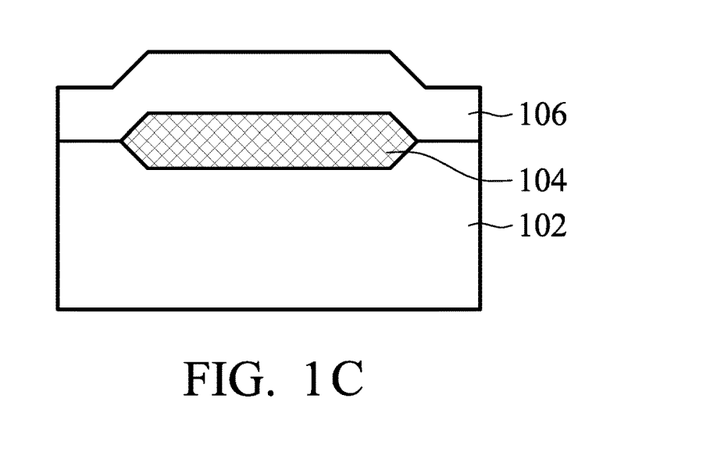

Referring to FIG. 1C, a semiconductor layer 106 is deposited over the insulator 104. In some embodiments, the semiconductor layer 106 includes silicon, either in polycrystalline or amorphous form. In alternative embodiments, the semiconductor layer 106 includes GaN, GaAs or other suitable III-V semiconductor materials (i.e., comprising a combination of one or more group III elements with one or more group V elements). The III-V semiconductor materials are particularly suitable for high-power devices because they have better thermal conductivity and can sustain higher temperature than silicon can. In some embodiments, the semiconductor layer 106 has a thickness of about 2000 angstroms to about 15000 angstroms.

Figure 1D:
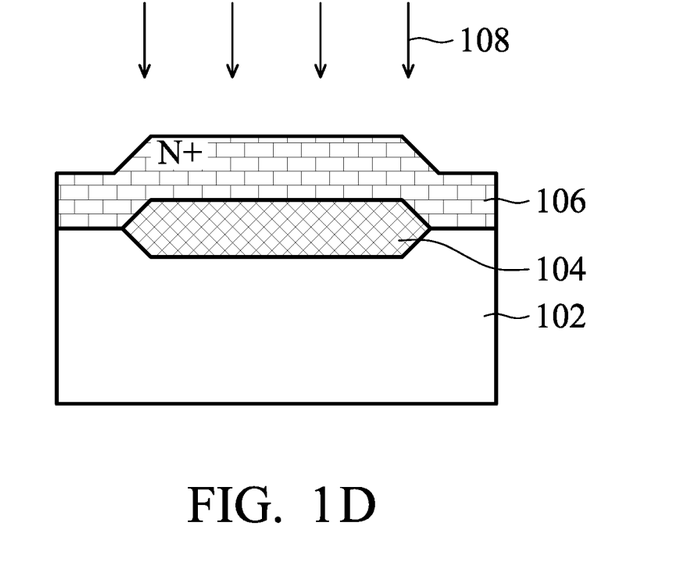

Referring to FIG. 1D, a first implantation process 108 is performed on the semiconductor layer 106 such that the semiconductor layer 106 has a first conductivity type, such as an N-type or a P-type. After performing the first implantation process 108, the semiconductor layer 106 may have a heavy doping concentration, such as in a range from about 5e13 atoms/cm$^2$ to about 5e15 atoms/cm$^2$. In some embodiments, in the first implantation process 108, the semiconductor layer 106 is entirely implanted without using a mask (e.g., photoresist). In some embodiments, the first implantation process 108 uses an ion energy ranging from about 5 KeV to about 250 KeV. For the sake of illustration, an N+ semiconductor layer 106 is shown in FIG. 1D although it may be also formed as a P+ semiconductor layer.

Figure 1E:
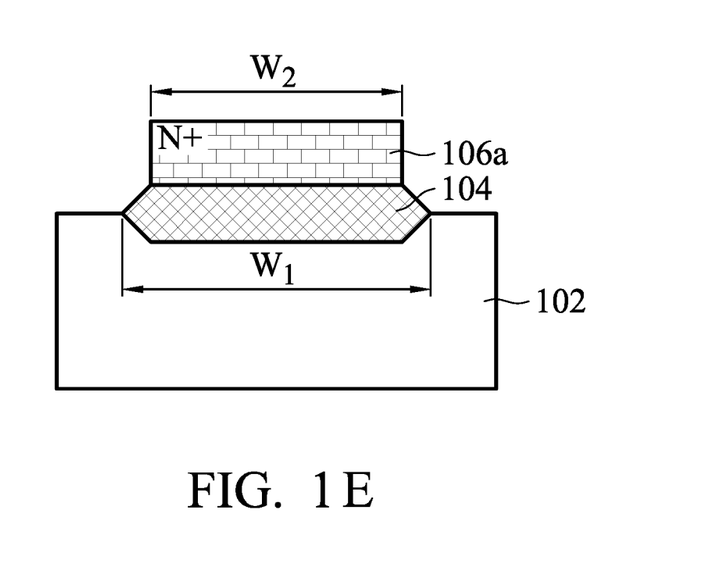

Afterwards, referring to FIG. 1E, the semiconductor layer 106 is patterned to a semiconductor layer 106a that has a second width $W_2$ smaller than the first width $W_1$ of the insulator 104. The second width $W_2$ may be in a range from about 1 μm to about 18 μm. In some embodiments, the semiconductor layer 106a is disposed on the insulator 104 and physically and electrically isolated with the semiconductor substrate 102 by the insulator 104.

Figure 1F:
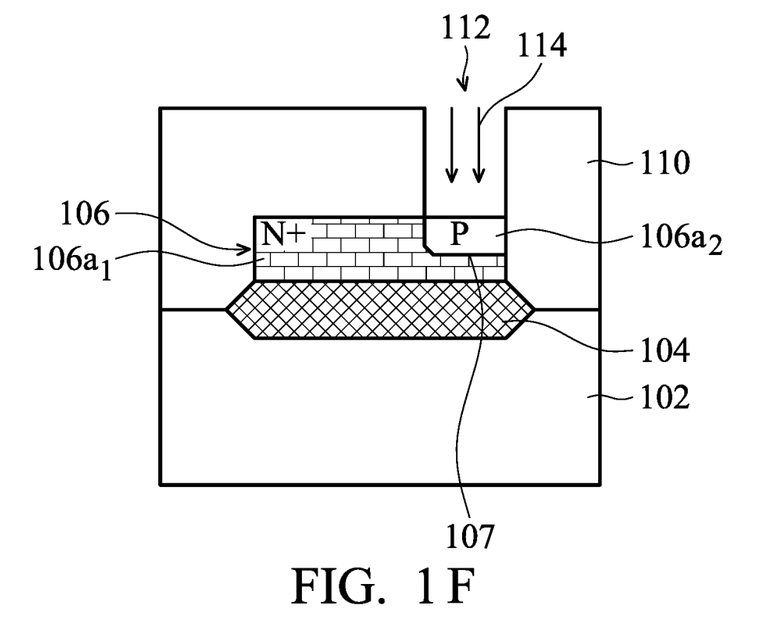

Afterwards, referring to FIG. 1F, a patterned photoresist layer 110 is formed over the semiconductor substrate 102. The patterned photoresist layer 110 has an opening 112 exposing a portion of the semiconductor layer 106a. The exposed portion of the semiconductor layer 106 is adjacent to a sidewall of the semiconductor layer 106a. A second implantation process 114 is performed on the exposed portion of the semiconductor layer 106 through the opening 112. The second implantation process 114 implants dopants of a second conductivity type into the exposed portion of the semiconductor layer 106a. The second conductivity type is opposite to the first conductivity type. For example, the second conductivity type is P-type when the first conductivity type is N-type, or vice versa. The patterned photoresist layer 110 may be removed after the second implantation process 114 is done.

After performing the second implantation process 114, the semiconductor layer 106a contains a first region $106a_1$ of the first conductivity type and a second region $106a_2$ of the second conductivity type. In some embodiments, the second region $106a_2$ has a doping concentration lighter than that of the first region $106a_1$. For example, the second region $106a_2$ may have a doping concentration ranging from about 1e13 atoms/cm$^2$ to about 1e15 atoms/cm$^2$. In some embodiments, the first region $106a_1$ of the first conductivity type has a volume of over 50-80% of the volume of the semiconductor layer 106a while the second region $106a_2$ occupies the remaining volume of the semiconductor layer 106a. The second region $106a_2$ is partially or entirely surrounded by the first region $106a_1$. The first and second regions $106a_1$ and $106a_2$ of the semiconductor layer 106a are in direct contact with each other and form a P-N junction 107. The first and second regions $106a_1$ and $106a_2$ of the semiconductor layer 106a may function as a zener diode. This kind of device is used in trimming circuits and in particular a zener-like trimming device. In some embodiments, the depth of the second region $106a_2$ of the semiconductor layer 106a is substantially the same as or less than of the thickness of the semiconductor layer 106a. For the sake of illustration, a P region $106a_2$ is shown in FIG. 1F although it may be also formed as an N region.

Figure 1G:
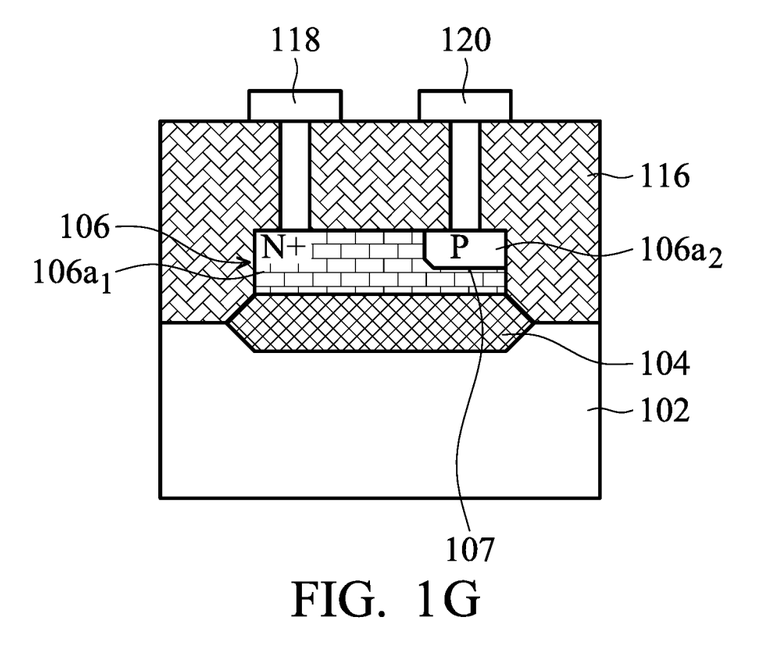

Afterwards, referring to FIG. 1G, an inter-layer dielectric (ILD) layer 116 is formed over the semiconductor substrate 102. A first metallization contact 118 and a second metallization contact 120 are formed through the ILD layer 116 to be in electrical contact with the first region $106a_1$ and the second region $106a_2$ of the semiconductor layer 106a, respectively. In some embodiments, the ILD layer 116 includes a low-k dielectric material, silicon oxide layer or a combination thereof. The low-k dielectric material has a dielectric constant less than about 3.0. A wide variety of low-k dielectric materials may be employed to form the low-k dielectric layer, including fluorinated silicon glass (FSG), carbon doped silicon oxide, Black diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the ILD layer 116 is formed by chemical vapor deposition (CVD), spin-on coating or other suitable techniques. In some embodiments, the first and second metallization contacts 118 and 120 are formed of a metal, which may be titanium, titanium nitride, tungsten, aluminum, tantalum, titanium nitride, or a combination thereof.

The semiconductor device 100 containing a zener diode can be manufactured easily. For example, the semiconductor layer 106a includes only two regions 106a1 and 106a$_2$ (e.g., the P regions and the N+ region as shown in FIG. 1G). The semiconductor layer 106a does not include a third region other than the first and second regions 106a$_1$ and 106a$_2$. Accordingly, during the process of manufacturing the zener diode, only two implantation processes 108 and 114 are needed to be performed on the semiconductor layer 106, and only one mask (e.g., the photoresist layer 110) is needed in these two implantation processes 108 and 114.

Figure 2A:
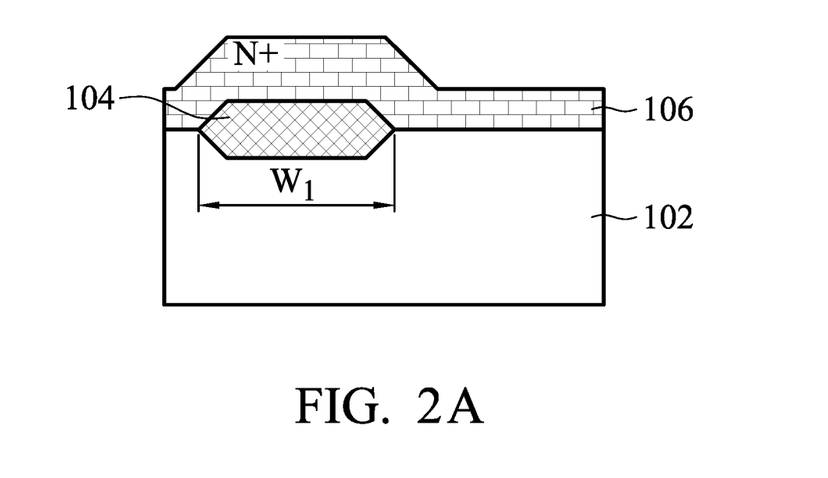
FIGS. 2A-D illustrate cross-sectional views of a semiconductor device at various stages of the manufacturing process, in accordance with some embodiments.

FIGS. 2A-D illustrate cross-sectional views of a semiconductor device at various stages of manufacturing processes, in accordance with some embodiments. Referring to FIG. 2A, a semiconductor device 200 similar to the semiconductor device 100 as shown in FIG. 1D is provided, including the semiconductor substrate 102, the insulator 104 and the semiconductor layer 106 of the first conductivity type. In some embodiments, the insulator 104 has the first width $W_1$.

Figure 2B:
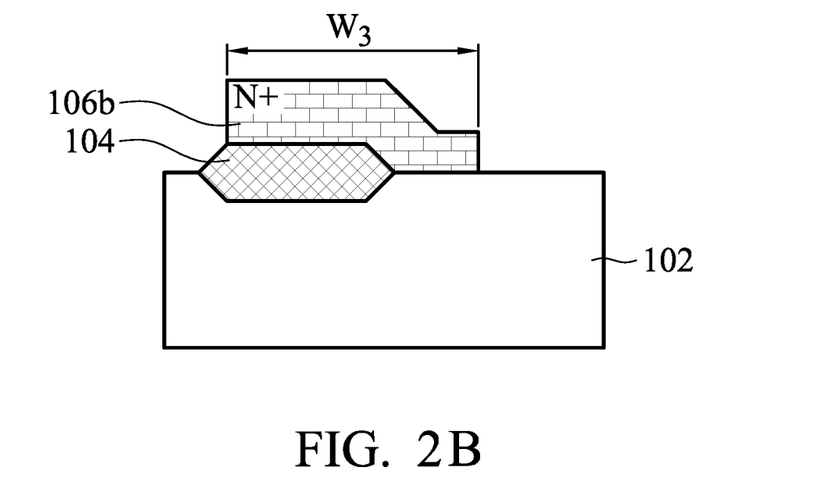

Afterwards, referring to FIG. 2B, the semiconductor layer 106 is patterned to a semiconductor layer 106b that has a third width $W_3$ which is greater than the first width $W_1$ of the insulator 104. The third width $W_3$ of the semiconductor layer 106b may be in a range from about 2 μm to about 25 μm. Accordingly, the semiconductor layer 106b has an extension portion that extends over a sidewall of the insulator 104 and is in direct contact with the semiconductor substrate 102.

Figure 2C:
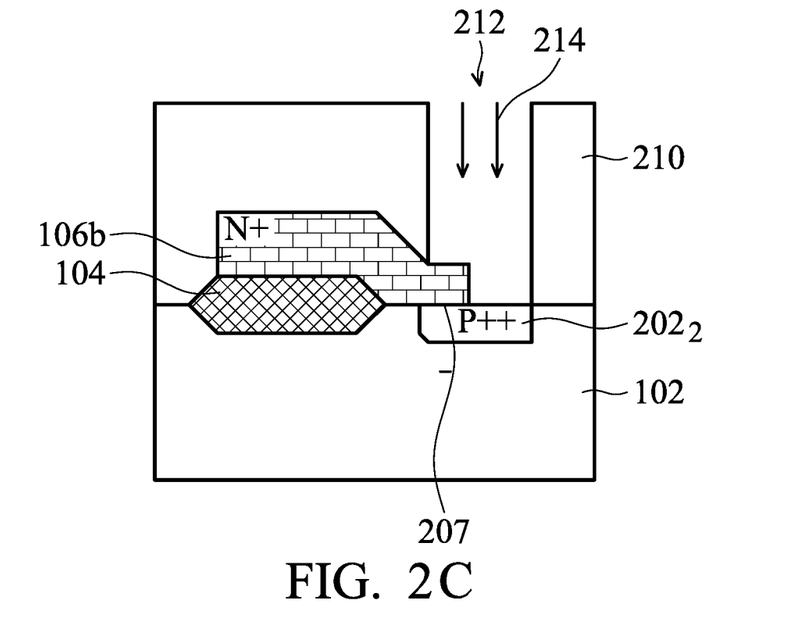

Afterwards, referring to FIG. 2C, a patterned photoresist layer 210, which is formed over the semiconductor substrate 102, has an opening 212 exposing at least a portion of the extension portion of the semiconductor layer 106b and a portion of the semiconductor substrate 102 adjacent to the semiconductor layer 106b. In some embodiments, the opening 212 also exposes a sidewall of semiconductor layer 106b.

A second implantation process 214 is then performed on the semiconductor substrate 102 through the opening 212. The second implantation process 214 implants dopants of the second conductivity type into the semiconductor substrate 102. A region 202$_2$ of the second conductivity type is formed in the semiconductor substrate 102, near the top surface of the semiconductor substrate 102. The second region 202$_2$ is partially covered by (i.e., under) the semiconductor layer 106b. In some embodiments, the second region 202$_2$ has a doping concentration heavier than that of the semiconductor layer 106b. For example, the region 202$_2$ may have a doping concentration ranging from about 5e13 atoms/cm$^2$ to about 8e15 atoms/cm$^2$. In some embodiments, the second implantation process 214 uses an ion energy ranging from about 5 KeV to about 200 KeV, such that the dopants may penetrate the semiconductor layer 106b to reach the semiconductor substrate 102 and forms the second region 202$_2$ near the top surface of the semiconductor substrate 102. An annealing process may be performed after the second implantation process. The patterned photoresist layer 210 may be removed after the second implantation process 214 is done. The semiconductor layer 106b and the region 202$_2$ may form a P-N junction 207 and function as a zener diode. For the sake of illustration, a P++ region 202$_2$ is shown in FIG. 2C although it may be also formed as an N++ region.

Figure 2D:
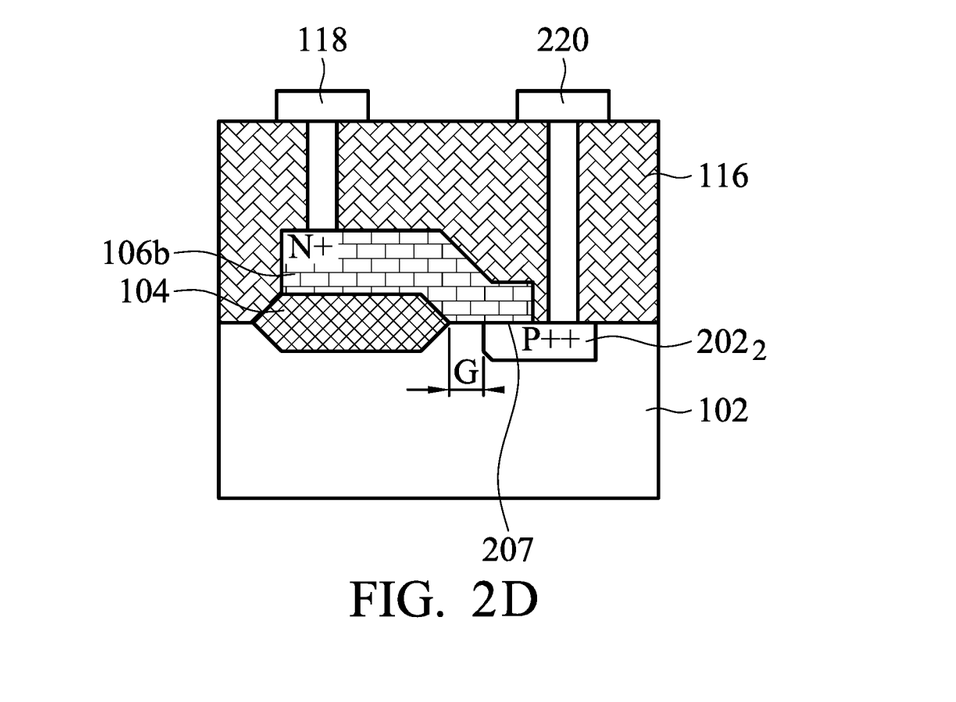

Afterwards, referring to FIG. 2D, the inter-layer dielectric (ILD) layer 116 is formed over the semiconductor substrate 102 and the patterned semiconductor layer 106b. The first metallization contact 118 is formed through the ILD layer 116 to be in electrical contact with the semiconductor layer 106b. A second metallization contact 220 is formed through the ILD layer 116 to in electrical contact a portion of the second region 202$_2$ that is not covered by the semiconductor layer 106b. The second metallization contact 220 does not penetrate the semiconductor layer 106b but has a horizontal gap G' between itself and the semiconductor layer 106b. The horizontal gap G' may be in a range from 0.5 μm to about 7 μm. Furthermore, there is a horizontal gap G between the insulator 104 and the second region 202$_2$, as shown in FIG. 2D.

The semiconductor device 200 containing a zener diode can be easily manufactured. For example, during the processes of manufacturing the zener diode, only two implantation processes 108 and 214 are needed to be performed on the semiconductor layer 106b, and only one mask (e.g., the patterned photoresist layer 210) is needed in these two implantation processes 108 and 214.

Figure 3:
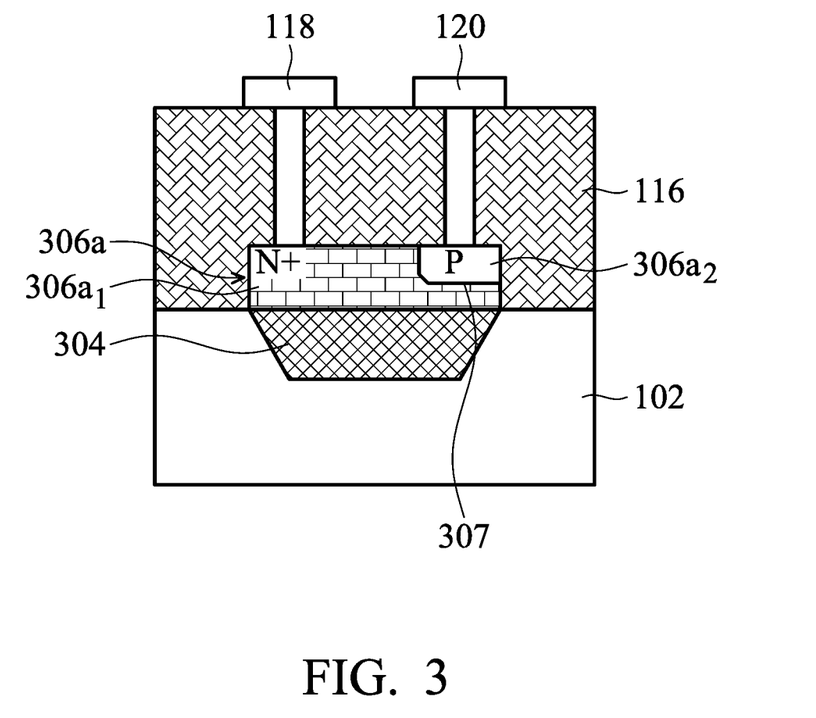
FIGS. 3 illustrate a cross-sectional view of a semiconductor device in accordance with some embodiments.

FIGS. 3 illustrate a cross-sectional view of a semiconductor device in accordance with some embodiments. A semiconductor device 300 that is similar to the semiconductor device 100, except that the insulator 304 is an STI structure, is provided. The formation of the isolation structure 304 includes patterning the semiconductor substrate 100 by a photolithography process, etching a recess, such as a trench, in the semiconductor substrate 102 (for example, by using a dry etching, wet etching, other applicable etching processes, or a combination thereof), and filling the recess (for example, by using chemical vapor deposition).

The insulator 304 may have the first width $W_1$. The insulator 304 may have a top surface level with that of the semiconductor substrate 102. The semiconductor substrate 102 may provide a flat surface for forming the semiconductor layer 306a on it. The semiconductor layer 306a may be made of the same material and by the same formation method as the semiconductor layer 106a described above. The semiconductor layer 306a may have the second width $W_2$ while the second region 306a$_2$ is located in the semiconductor layer, although the semiconductor layer 306a may have the third width $W_3$ while the second region is a position like the second region 202$_2$ as shown in FIG. 2D (in the semiconductor substrate). The first region 306a$_1$ and the second region 306a$_2$ form a P-N junction 307 therebetween and may function as a zener diode.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or layer to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
    an insulator formed on a top surface of a semiconductor substrate;
    a semiconductor layer, containing a first region of a first conductivity type, formed on the insulator layer, wherein the first region is a P+ region or an N+ region;
    a second region of a second conductivity type in direct contact with the first region and forming a P-N junction with the first region, wherein a portion of the P-N junction is parallel to the top surface of the semiconductor substrate, and the second region is in a first portion of the semiconductor substrate and partially covered by the semiconductor layer, and wherein the second region has a first horizontal gap with the insulator;
    a first metallization contact in electrical contact with the first region; and
    a second metallization contact in electrical contact with the second region, wherein the second metallization contact extends from a top surface of a lower portion of the semiconductor layer to a bottom surface of the lower portion of the semiconductor layer with a second horizontal gap between the bottom surface of the lower portion of the semiconductor layer and the second metallization contact.

2. The semiconductor device as claimed in claim 1, wherein the semiconductor layer has an extension portion extending over a sidewall of the insulator and in direct contact with the first portion and a second portion of the semiconductor substrate, wherein the second portion of the semiconductor substrate does not comprise the second region.

3. The semiconductor device as claimed in claim 1, wherein the second metallization contact is physical contact with a portion of the second region that is not covered by the semiconductor layer.

4. The semiconductor device as claimed in claim 3, wherein the second horizontal gap is less than the first horizontal gap.

5. The semiconductor device as claimed in claim 1, wherein the semiconductor layer comprises silicon.

6. The semiconductor device as claimed in claim 1, wherein the semiconductor layer comprises GaN, GaAs or other III-V semiconductor materials.

7. The semiconductor device as claimed in claim 1, wherein the insulator comprises a local oxidation of silicon structure, and the insulator has a sidewall connecting an outermost sidewall of the semiconductor layer and the top surface of the semiconductor substrate.

8. The semiconductor device as claimed in claim 1, wherein the insulator comprises a shallow trench isolation structure.

9. The semiconductor device as claimed in claim 1, wherein a top surface of the insulator is higher than the top surface of the semiconductor substrate.

10. The semiconductor device as claimed in claim 1, wherein a thickness of the semiconductor layer is about 2000 angstroms to about 15000 angstroms.

11. The semiconductor device as claimed in claim 1, wherein a second width of the semiconductor layer is greater than a first width of the insulator.

12. The semiconductor device as claimed in claim 11, wherein the first width is ranging from about 1 μm to about 20 μm, and the second width is ranging from about 2 μm to about 25 μm.

13. The semiconductor device as claimed in claim 1, further comprising an inter-layer dielectric layer formed over the semiconductor substrate, wherein the inter-layer dielectric layer directly contacts the semiconductor substrate, the insulator, and the semiconductor layer, and the inter-layer dielectric layer extends from a top surface of the semiconductor layer to the second region.

14. The semiconductor device as claimed in claim 1, wherein a second doping concentration of the second region is heavier than a first doping concentration of the first region.

15. The semiconductor device as claimed in claim 14, wherein the second doping concentration is in a range from about 5e13 atoms/cm$^2$ to about 8e15 atoms/cm$^2$.

16. A method for manufacturing the semiconductor device of claim 1, comprising:
    forming an insulator on a semiconductor substrate;
    depositing a semiconductor layer over the insulator and the semiconductor substrate;
    performing a first implantation process on the semiconductor layer to give it a first conductivity type;
    patterning the semiconductor layer such that the semiconductor layer is partially located on the insulator and has an extension portion in direct contact with the semiconductor substrate;
    forming a photoresist layer over the semiconductor substrate, wherein the photoresist layer has an opening exposing a portion of extension portion of the semiconductor layer and a portion of the semiconductor substrate; and
    performing a second implantation process on the semiconductor substrate, through the opening, to form a region of a second conductivity type in the semiconductor substrate, wherein the region of the second conductivity type is partially covered by the semiconductor layer, wherein the region of the second conductivity type in direct contact with the semiconductor layer of the first conductivity type to form a P-N junction, and wherein the P-N junction is parallel to a top surface of the semiconductor substrate.

17. The method as claimed in claim 16, further comprising:
    removing the photoresist layer after performing the second implantation process;
    forming an inter-layer dielectric layer over the semiconductor substrate and the semiconductor layer;
    forming a first metallization contact and a second metallization contact in electrical contact with the semiconductor layer of the first conductivity type and the region of the second conductivity type, respectively.

18. The method as claimed in claim 16, wherein the second implantation process uses an ion energy ranging from about 5 KeV to about 250 KeV.

19. The method as claimed in claim 16, wherein the semiconductor layer is entirely implanted without using a mask in the first implantation process.

20. The method as claimed in claim 16, wherein the opening of the photoresist layer comprises exposing a sidewall of the semiconductor layer.

* * * * *